United States Patent
Shimura et al.

(10) Patent No.: US 12,197,129 B2
(45) Date of Patent: Jan. 14, 2025

(54) SUBSTRATE TREATMENT METHOD AND SUBSTRATE TREATMENT SYSTEM

(71) Applicant: Tokyo Electron Limited, Tokyo (JP)

(72) Inventors: Satoru Shimura, Koshi (JP); Soichiro Okada, Koshi (JP); Masashi Enomoto, Koshi (JP); Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 920 days.

(21) Appl. No.: 17/268,362

(22) PCT Filed: Aug. 21, 2019

(86) PCT No.: PCT/JP2019/032581
§ 371 (c)(1),
(2) Date: Feb. 12, 2021

(87) PCT Pub. No.: WO2020/040178
PCT Pub. Date: Feb. 27, 2020

(65) Prior Publication Data
US 2021/0318618 A1  Oct. 14, 2021

(30) Foreign Application Priority Data
Aug. 23, 2018  (JP) .................. 2018-156625

(51) Int. Cl.
*G03F 7/11* (2006.01)
*G03F 7/16* (2006.01)
*H01L 21/027* (2006.01)

(52) U.S. Cl.
CPC ............ *G03F 7/11* (2013.01); *G03F 7/161* (2013.01); *H01L 21/0273* (2013.01)

(58) Field of Classification Search
CPC . G03F 7/11; G03F 7/161; G03F 7/091; G03F 7/16; H01L 21/0273; B05D 1/38; B05D 3/00

See application file for complete search history.

(56) References Cited

U.S. PATENT DOCUMENTS

| | | | | |
|---|---|---|---|---|
| 6,027,760 A | * | 2/2000 | Gurer | B05D 1/005 118/712 |
| 6,383,913 B1 | * | 5/2002 | Tsai | H01L 21/7681 438/643 |

(Continued)

FOREIGN PATENT DOCUMENTS

| JP | H09-171951 A | 6/1997 |
|---|---|---|
| JP | 2017-507360 A | 3/2017 |

(Continued)

*Primary Examiner* — Sean M DeGuire
*Assistant Examiner* — Alexander N. Lee
(74) *Attorney, Agent, or Firm* — Posz Law Group, PLC

(57) ABSTRACT

A substrate treatment method of treating a treatment object substrate includes before applying a resist solution for forming a resist film onto a base film formed on a substrate surface of the treatment object substrate, making a determination of which one of a first treatment and a second treatment to perform based on the treatment object substrate. In response to the determination determining to perform the first treatment, performing the first treatment of decreasing a polarity of the base film to bring it closer to a polarity of the resist solution. In response to the determination determining to perform the second treatment, performing a treatment of increasing the polarity of the base film to bring it closer to the polarity of the resist solution.

13 Claims, 14 Drawing Sheets

(A)

(B)

(C)

(56) References Cited

U.S. PATENT DOCUMENTS

| | | | | |
|---|---|---|---|---|
| 2002/0006737 A1* | 1/2002 | Kitano | ............ | G03F 7/168 |
| | | | | 430/311 |
| 2003/0152875 A1* | 8/2003 | Morales | ............ | G03F 7/168 |
| | | | | 427/532 |
| 2007/0154844 A1* | 7/2007 | Takebe | ............ | C07C 43/17 |
| | | | | 430/311 |
| 2007/0161230 A1* | 7/2007 | Chen | ............ | H01L 21/7682 |
| | | | | 438/789 |
| 2008/0085466 A1* | 4/2008 | Harada | ............ | G03F 7/2041 |
| | | | | 430/296 |
| 2011/0269078 A1* | 11/2011 | Rathsack | ............ | G03F 7/2004 |
| | | | | 430/324 |
| 2012/0273460 A1* | 11/2012 | Kang | ............ | C08F 293/005 |
| | | | | 524/588 |
| 2013/0330668 A1* | 12/2013 | Wu | ............ | C08F 4/04 |
| | | | | 526/216 |
| 2014/0091435 A1* | 4/2014 | Chan | ............ | H01L 21/0271 |
| | | | | 257/618 |
| 2015/0255271 A1* | 9/2015 | Muramatsu | ............ | H01L 21/0271 |
| | | | | 156/345.1 |
| 2017/0371247 A1* | 12/2017 | Haq | ............ | G03F 7/0382 |
| 2018/0004085 A1* | 1/2018 | Wuister | ............ | G03F 7/039 |

FOREIGN PATENT DOCUMENTS

| | | |
|---|---|---|
| KR | 10-2009-0117324 A | 11/2009 |
| KR | 10-2015-0058209 A | 5/2015 |
| WO | 2015-127348 A1 | 8/2015 |

* cited by examiner

FIG.1
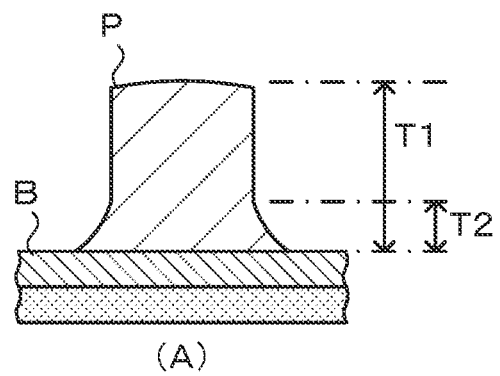
(A)
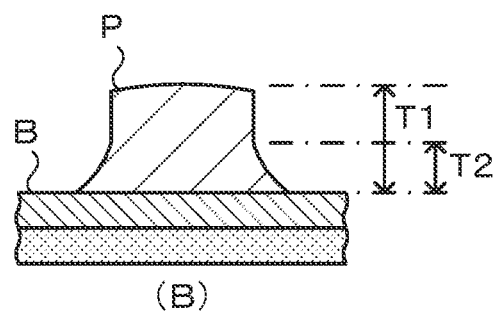
(B)
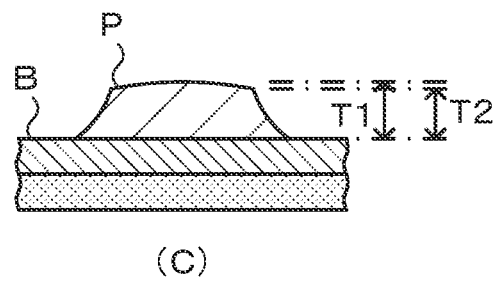
(C)

FIG.2
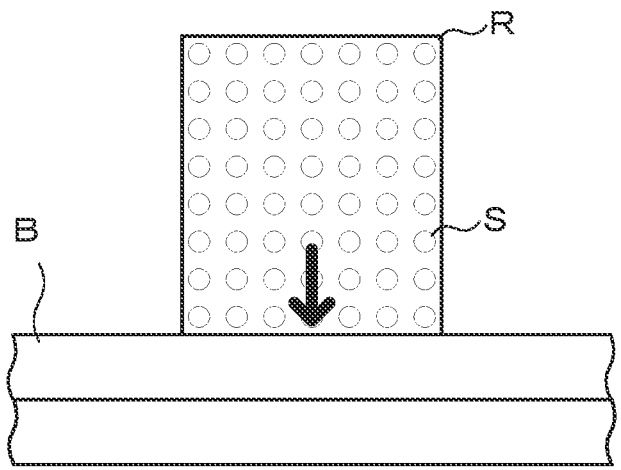
(A)
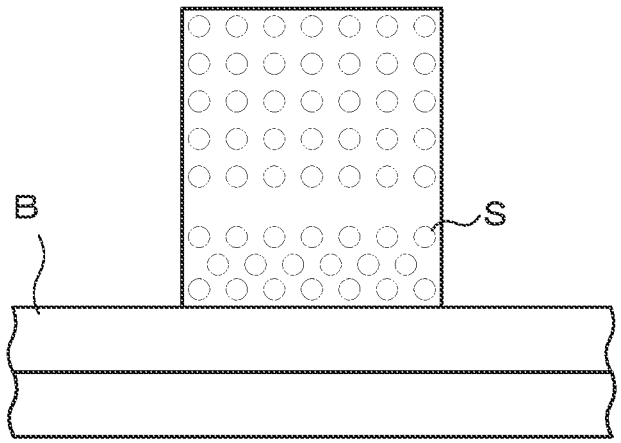
(B)

SUBSTRATE TREATMENT METHOD AND SUBSTRATE TREATMENT SYSTEM

This application is a U.S. national stage application of International Application No. PCT/JP2019/032581 filed on Aug. 21, 2019, based upon and claims the benefit of priority of the prior Japanese Patent Application No. 2018-156625 filed on Aug. 23, 2018, the entire contents of which are incorporated herein by reference.

TECHNICAL FIELD

This disclosure relates to a substrate treatment method and a substrate treatment system.

BACKGROUND ART

Patent Document 1 discloses a method of decreasing EUV shot noise contributing LWR (Line Edge Roughness) or the like at the time of patterning in patterning using a photosensitized chemically amplified resist (PS-CAR) so as to utilize an extreme ultraviolet ray (EUV) light source. In the method disclosed in Patent Document 1, between EUV pattern exposure using a patterned mask and flood exposure not using the patterned mask, photosensitizer molecules produced in a PS-CAR layer are diffused during EUV pattern exposure.

PRIOR ART DOCUMENT

Patent Document

Patent Document 1: Japanese Translation of PCT International Application Publication No. 2017-507360

DISCLOSURE OF THE INVENTION

Problems to Be Solved by the Invention

A technique according to this disclosure further improves the roughness of a resist pattern.

Means for Solving the Problems

An aspect of this disclosure is a substrate treatment method of treating a treatment object substrate, the substrate treatment method including before applying a resist solution for forming a resist film onto a base film formed on a substrate surface of the treatment object substrate, performing a treatment of decreasing a polarity of the base film when the polarity of the base film is higher than a polarity of the resist solution, and performing a treatment of increasing the polarity of the base film when the polarity of the base film is lower than the polarity of the resist solution.

Effect of the Invention

According to this disclosure, the roughness of a resist pattern can be further improved.

BRIEF DESCRIPTION OF THE DRAWINGS

FIG. 1 is a view schematically illustrating the result of a test carried out by the present inventors.

FIG. 2 is a view for explaining the reason why a wide portion with a specific thickness not depending on a film thickness of a resist pattern is formed on a base film side in the resist pattern.

EMBODIMENTS FOR CARRYING OUT THE INVENTION

Figure 3:
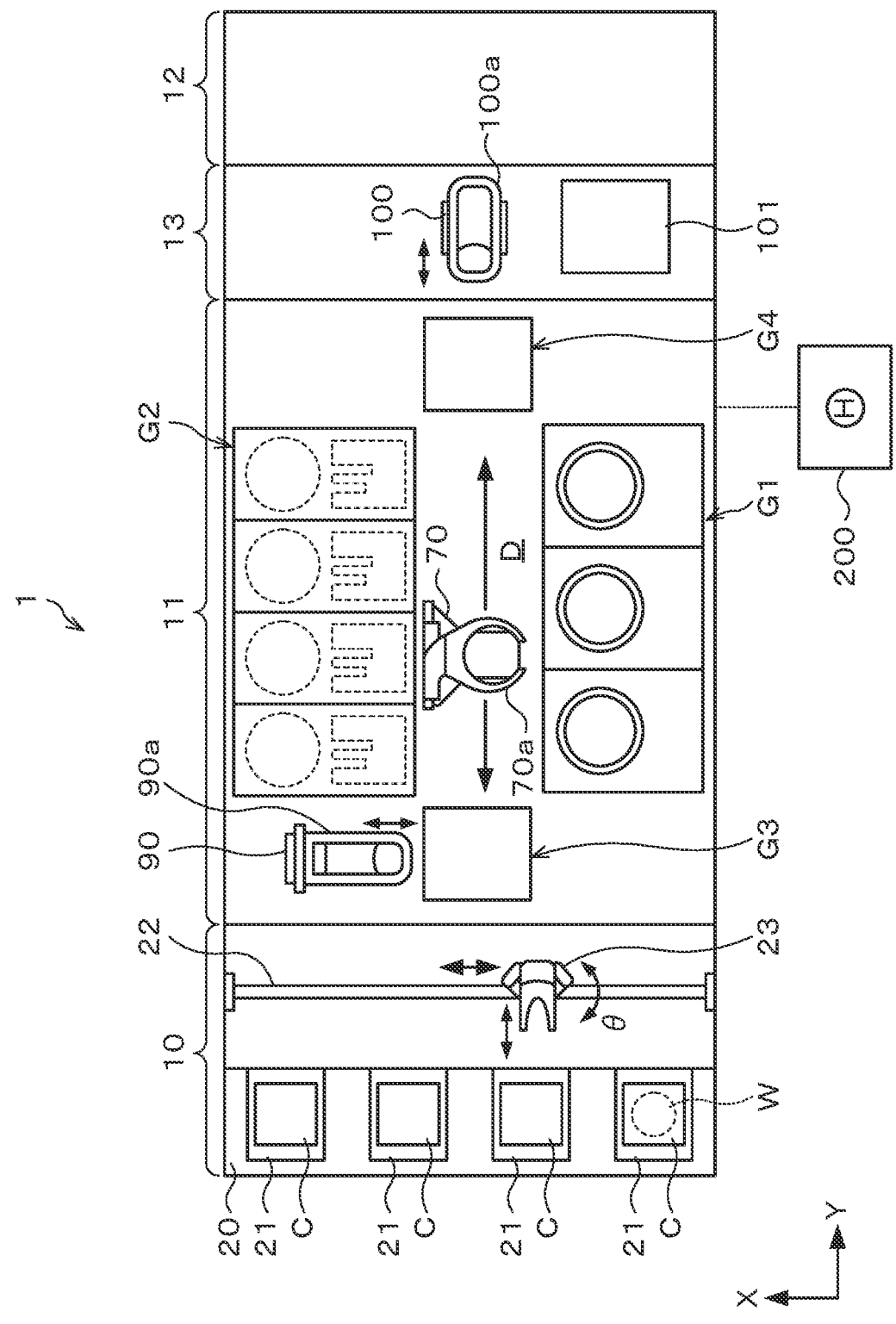
FIG. 3 is a plan view illustrating the outline of a configuration of a substrate treatment system according to a first embodiment.

At a photolithography step in a manufacturing process of a semiconductor device or the like, a series of treatments is performed to form a desired predetermined resist pattern on a semiconductor wafer (hereinafter, referred to as a "wafer") as a treatment object substrate. The above series of treatments includes, for example, a resist coating treatment of applying a resist solution onto the wafer to form a coating film of the resist solution, a pre-baking treatment of heating the coating film to form a resist film, exposure processing of exposing the resist film, a developing treatment of developing the exposed resist film, and so on.

Incidentally, the resist pattern needs to be improved in roughness represented by LER or LWR (Light Width Roughness), and various methods are proposed. Note that LER represents the unevenness degree of a side wall of the line pattern, and LWR represents the variation degree of the line width.

For example, Patent Document 1 discloses the method of improving LER or the like by diffusing the photosensitizer molecules generated in the PS-CAR layer during the EUV pattern exposure between the EUV pattern exposure using the patterned mask and the flood exposure as explained above.

However, in recent years, for higher integration of semiconductor devices, the miniaturization of the resist pattern is advanced, and further improvement of the roughness such as LER in the resist pattern is required accompanying the miniaturization. In particular, the resist film is progressively made thinner for a lower dose amount in order to improve the throughput or for miniaturization, and therefore an improvement in roughness in the thin resist pattern is required.

Hence, the technique according to this disclosure further improves the roughness of the resist pattern.

FIG. 1 is a view illustrating the result of the earnest study carried out by the present inventors for the improvement in roughness. FIG. 1(A) schematically illustrates the cross-sectional shape of a resist pattern P when a film thickness T1 of the resist pattern P formed on a base film B is 70 nm. Similarly, FIG. 1(B) and FIG. 1(C) schematically illustrate the cross-sectional shapes when the film thicknesses T1 are 50 nm and 30 nm, respectively.

As illustrated in FIG. 1(A) to FIG. 1(C), the resist pattern P is formed wide at a boundary portion with the base film B, irrespective of its film thickness. Besides, a thickness T2 of the wide portion is constant irrespective of the film thickness T1 of the resist pattern P, and is 20 nm to 30 nm. In short, the resist pattern P has the wide portion having a specific thickness formed at the boundary portion with the base film B, irrespective of its film thickness.

Its conceivable cause is as follows. Specifically, during a period after the resist solution is applied to the base film B until it is solidified, a solute S having a polarity of the resist solution located at a portion on the base film B side moves to the base film B side in a coating film R of the resist solution on the base film B as illustrated in FIG. 2(A). Therefore, after a lapse of time, the solute S is unevenly distributed on the base film B side in the coating film R as illustrated in FIG. 2(B). As a result of this, when the coating film R of the resist solution is heated and thereby solidified to form into a resist film, the bond between the base film B and the resist film becomes strong. Accordingly, the acid generated in the resist film during exposure becomes less likely to be diffused on the base film B side, so that a portion of the resist film on the base film B side becomes less likely to be dissolved in a developing solution. Therefore, when the resist film is exposed and developed and thereby the resist pattern P is formed, the wide portion is formed at the boundary portion of the resist pattern with the base film B. The thickness (height) of a region where the solute S is unevenly distributed in the coating film R contributes to the thickness T2 of the wide portion, and the thickness of the uneven distribution region is decided by the state of the resist solution and the state of the surface of the base film B but does not depend on the film thickness of the coating film R (resist film). Accordingly, it is considered that the wide portion having the specific thickness is formed at the boundary portion with the base film B in the resist pattern P irrespective of its film thickness.

As a result of the earnest study carried out by the present inventors, the following has been found. Specifically, it has been found that by adjusting the polarity of a base film surface in conformity with the polarity of the resist solution before the resist solution is applied, the uneven distribution of the solute having the polarity in the resist solution can be suppressed to suppress the formation of the wide portion of the resist pattern, thereby improving the roughness of the pattern.

A substrate treatment method and a substrate treatment system according to this embodiment explained below are based on the above finding.

Hereinafter, a substrate treatment method and a substrate treatment system according to embodiments will be explained referring to the drawings. Note that the same codes are given to components having substantially the same functional configurations in the description and the drawings to omit duplicated explanation.

First Embodiment

Figure 4:
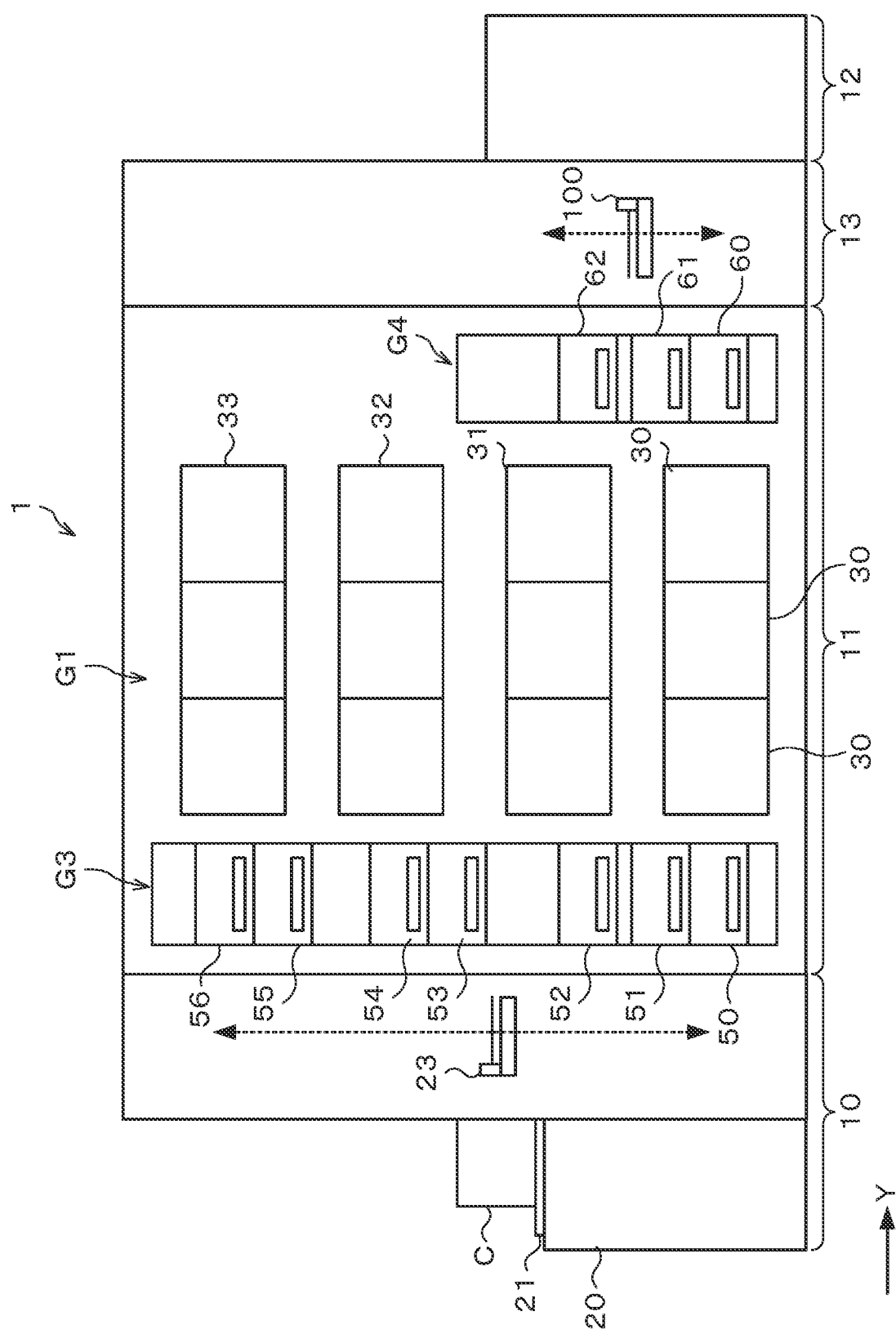
FIG. 4 is a front view illustrating the outline of the configuration of the substrate treatment system according to the first embodiment.
Figure 5:
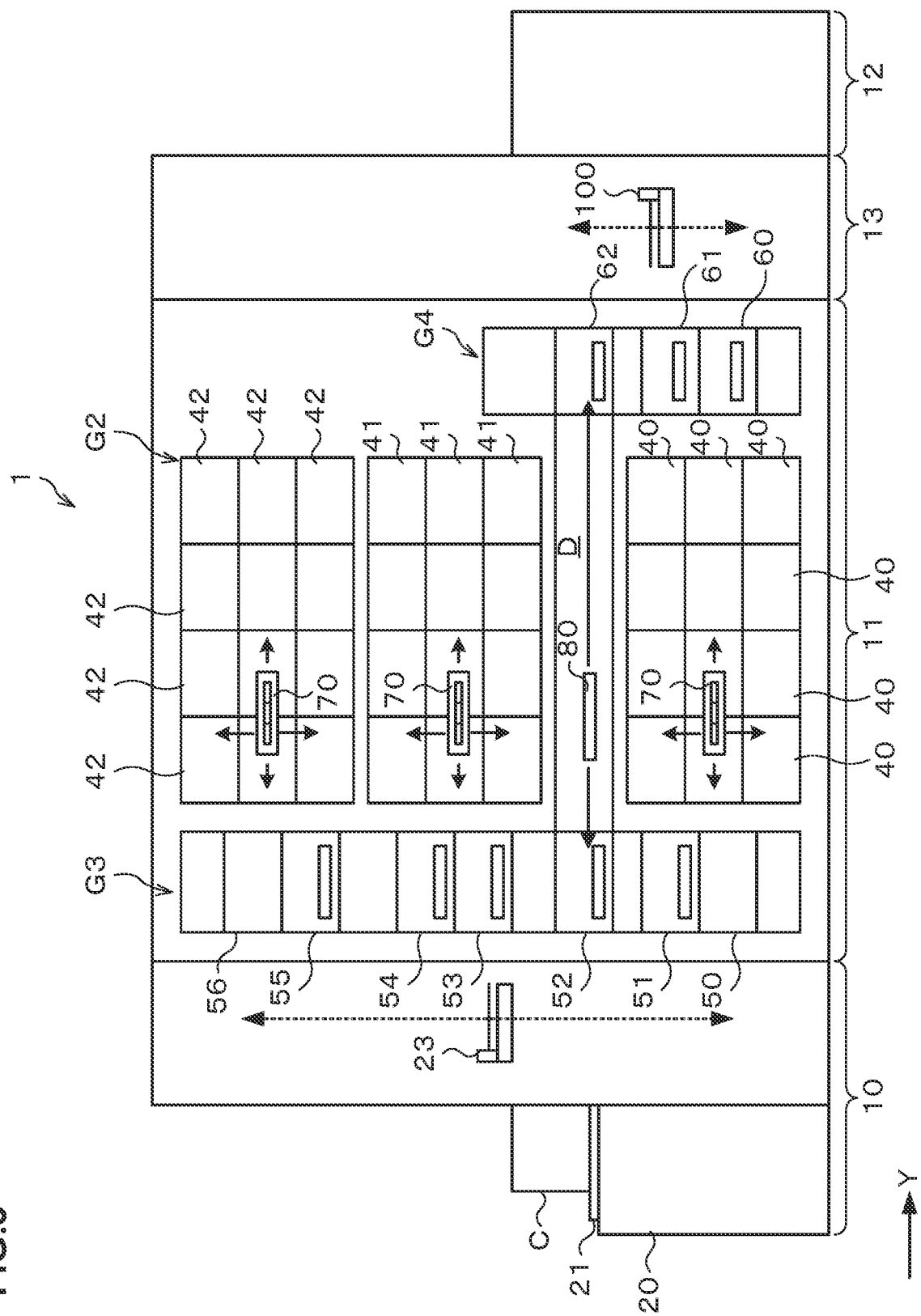
FIG. 5 is a rear view illustrating the outline of the configuration of the substrate treatment system according to the first embodiment.

FIG. 3 is an explanatory view illustrating the outline of an internal configuration of a substrate treatment system 1 according to a first embodiment. FIG. 4 and FIG. 5 are a front view and a rear view illustrating the outline of the internal configuration of the substrate treatment system 1, respectively. Note that in this embodiment, a case where the substrate treatment system 1 is a coating and developing treatment system which performs coating and developing treatments on the wafer W will be explained as an example.

As illustrated in FIG. 3, the substrate treatment system 1 has a cassette station 10 into/out of which a cassette C housing a plurality of wafers W is transferred, and a treatment station 11 including a plurality of various treatment apparatuses which perform predetermined treatments on the wafer W. The substrate treatment system 1 has a configuration in which the cassette station 10, the treatment station 11, and an interface station 13 which delivers the wafer W to/from an exposure apparatus 12 adjacent to the treatment station 11, are integrally connected.

In the cassette station 10, a cassette stage 20 is provided. The cassette stage 20 is provided with a plurality of cassette stage plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction in the drawing. The wafer transfer apparatus 23 is movable also in an up-down direction and around a vertical axis (in a θ-direction), and can transfer the wafer W between the cassette C on each of the cassette stage plates 21 and a delivery apparatus in a later-explained third block G3 in the treatment station 11.

In the treatment station 11, a plurality of, for example, four blocks G1, G2, G3, G4 each including various apparatuses are provided. For example, the first block G1 is provided on the front side (X-direction negative direction side in FIG. 3) in the treatment station 11, and the second block G2 is provided on the rear side (X-direction positive direction side in FIG. 3) in the treatment station 11. Further, the third block G3 is provided on the cassette station 10 side (Y-direction negative direction side in FIG. 3) in the treatment station 11, and the fourth block G4 is provided on the interface station 13 side (Y-direction positive direction side in FIG. 3) in the treatment station 11.

In the first block G1, as illustrated in FIG. 4, a plurality of solution treatment apparatuses, for example, developing treatment apparatuses 30, lower anti-reflection film forming apparatuses 31, resist coating apparatuses 32, and upper anti-reflection film forming apparatuses 33 are arranged in this order from the bottom.

The developing treatment apparatus 30 performs a developing treatment on the wafer W.

The lower anti-reflection film forming apparatus 31 is an example of a base film forming apparatus and forms a base film for the resist film. More specifically, the lower anti-reflection film forming apparatus 31 forms an anti-reflection film (hereinafter, referred to as a "lower anti-reflection film") composed of an organic acid, as a base film, at a lower layer of the resist film of the wafer W. Note that, in this example, the lower anti-reflection film forming apparatus 31 is to form SiARC (Silicon containing Anti-reflection Coating) composed of an organic acid as a based film.

The resist coating apparatus 32 applies a resist solution onto the lower anti-reflection film of the wafer W to form a coating film of the resist solution. The resist coating apparatus 32 forms a coating film, for example, with a resist solution for EUV exposure.

The upper anti-reflection film forming apparatus 33 forms an anti-reflection film (hereinafter, referred to as an "upper anti-reflection film") at an upper layer of the resist film formed by performing a heat treatment on the coating film of the resist solution on the wafer W.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the developing treatment apparatus 30, the lower anti-reflection film forming apparatus 31, the resist coating apparatus 32, and the upper anti-reflection film forming apparatus 33, for example, spin coating of applying a predetermined coating solution onto the wafer W is performed. In the spin coating, the coating solution is discharged, for example, from a coating nozzle onto the wafer W, and the wafer W is rotated to diffuse the coating solution over the surface of the wafer W.

In the second block G2, as illustrated in FIG. 5, thermal treatment apparatuses 40, UV radiation apparatuses 41, and HMDS treatment apparatuses 42 are provided.

The thermal treatment apparatus 40 performs thermal treatments such as heating and cooling on the wafer W.

The UV radiation apparatus 41 is an example of a polarity adjusting apparatus which adjusts the polarity of the base film on the wafer, and is used when the polarity of the base film on the wafer W is lower than the polarity of the resist solution. The UV radiation apparatus 41 performs a UV radiation treatment of radiating ultraviolet light (UV light) to the entire surface of the base film when the polarity of the base film on the wafer W is lower than the polarity of the resist solution. This makes the polarity of the base film on the wafer W almost the same as the polarity of the resist solution. The wavelength of the UV light radiated from the UV radiation apparatus 41 is, for example, 172 nm.

The HMDS treatment apparatus 42 is also an example of a polarity adjusting apparatus which adjusts the polarity of the base film on the wafer, similarly to the UV radiation apparatus 41. However, the HMDS treatment apparatus 42 is used when the polarity of the base film on the wafer W is higher than the polarity of the resist solution, unlike the UV radiation apparatus 41. When the polarity of the base film on the wafer W is lower than the polarity of the resist solution, the HMDS treatment apparatus 42 supplies a hexa-methyldisilazane (HMDS) gas to the surface of the base film to perform a treatment of causing HMDS to chemically react with the surface of the base film so as to hydrophobize it. The hydrophobic treatment (HMDS treatment) makes the polarity of the base film on the wafer W almost the same as the polarity of the resist solution.

The thermal treatment apparatuses 40, the UV radiation apparatuses 41, and the HMDS treatment apparatuses 42 are provided side by side in the up-down direction and in the horizontal direction, and the numbers and the arrangement of them can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

In a region surrounded by the first block G1 to the fourth block G4 as illustrated in FIG. 3, a wafer transfer region D is formed. In the wafer transfer region D, a wafer transfer apparatus 70 is arranged.

The wafer transfer apparatuses 70 has a transfer arm 70a movable, for example, in the Y-direction, the X-direction, the θ-direction, and the up-down direction. The wafer transfer apparatus 70 can move in the wafer transfer region D and transfer the wafer W to a predetermined unit in the first block G1, the second block G2, the third block G3, and the fourth block G4 located therearound. A plurality of the wafer transfer apparatuses 70 are arranged one above the other, for example, as illustrated in FIG. 5, and each can transfer the wafer W to, for example, a predetermined unit at the same height in each of the blocks G1 to G4.

Further, in the wafer transfer region D, a shuttle transfer apparatus 80 is provided which linearly transfers the wafer W between the third block G3 and the fourth block G4.

The shuttle transfer apparatus 80 can linearly move, for example, in the Y-direction in FIG. 5. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 3, a wafer transfer apparatus 90 is provided adjacent to the X-direction positive direction side of the third block G3. The wafer transfer apparatus 90 has a transfer arm 90a movable, for example, in the X-direction, the θ-direction, and the up-down direction. The wafer transfer apparatus 90 can move up and down while supporting the wafer W and transfer the wafer W to each of the delivery apparatuses in the third block G3.

In the interface station 13, a wafer transfer apparatus 100 and a delivery apparatus 101 are provided. The wafer transfer apparatus 100 has a transfer arm 100a movable, for example, in the Y-direction, the θ-direction, and the up-down direction. The wafer transfer apparatus 100 can transfer the wafer W to/from each of the delivery apparatuses in the fourth block G4, the delivery apparatus 101, and the exposure apparatus 12, for example, while supporting the wafer W by the transfer arm 100a.

The above substrate treatment system 1 is provided with a controller 200 as illustrated in FIG. 3. The controller 200 is composed of, for example, a computer including a CPU, a memory and so on, and includes a program storage (not illustrated). The program storage stores a program for controlling the treatments on the wafer W in the substrate treatment system 1. Note that the above program may be the one which is recorded in a computer-readable storage medium H and installed from the storage medium H into the control unit 200.

Figure 6:
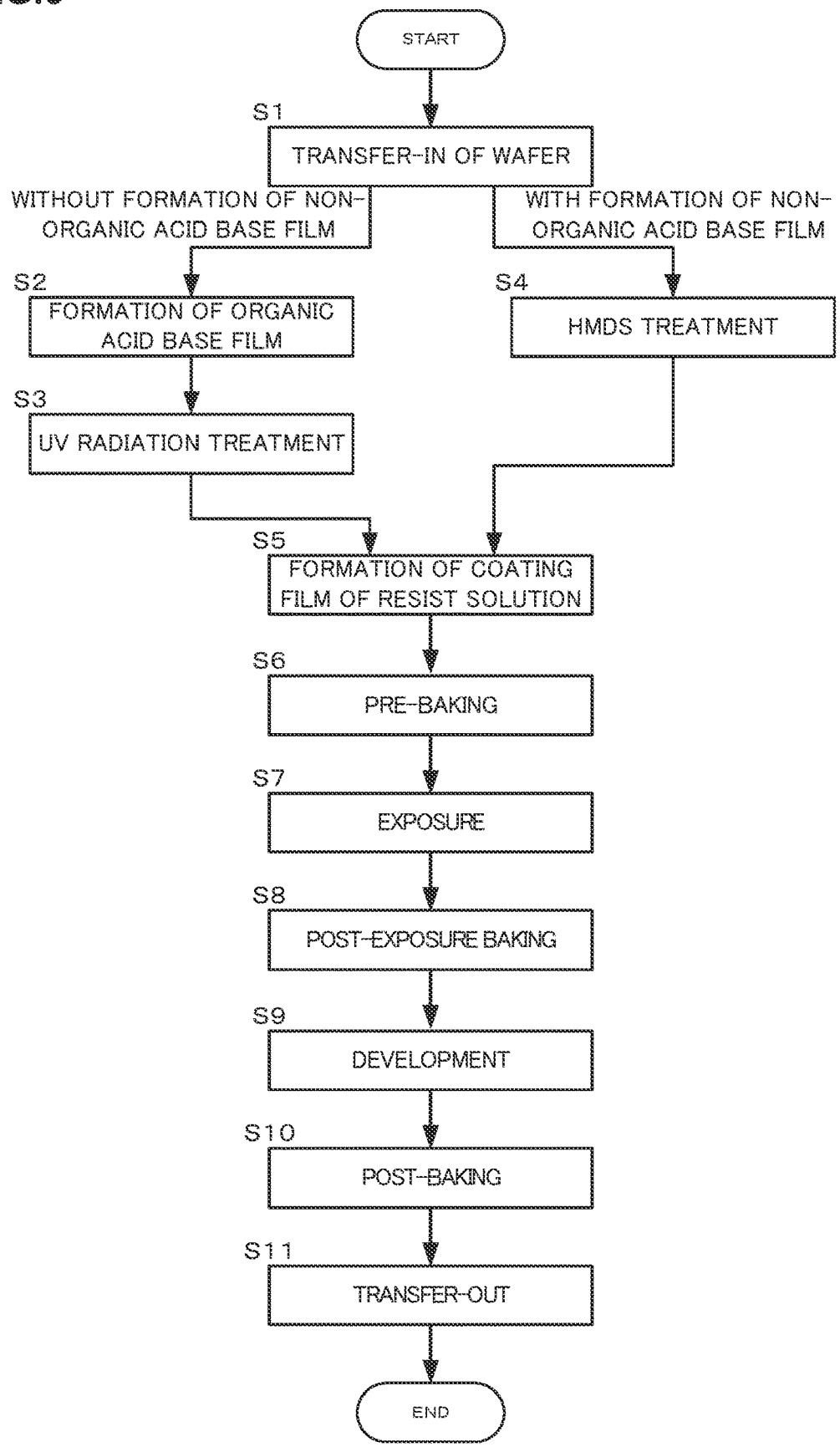
FIG. 6 is a flowchart for explaining an example of a wafer treatment according to the first embodiment.

Next, a wafer treatment performed using the substrate treatment system 1 configured as above will be explained using FIG. 6. FIG. 6 is a flowchart for explaining an example of the wafer treatment. Note that on the wafer W being an object to be treated, the base film has been already formed before the treatment in the substrate treatment system 1 in some cases or the base film is formed in the substrate treatment system 1 in some cases.

As illustrated, the wafer W is first transferred into the substrate treatment system 1 (Step S1). More specifically, the wafers W are successively taken out of the cassette C on the stage plate 21 by the wafer transfer apparatus 23 and transferred, for example, to the delivery apparatus 53 in the third block G3 in the treatment station 11.

Then, in the case where the lower anti-reflection film, namely, the base film composed of a non-organic acid has not been formed on the wafer W, the wafer W is transferred to the lower anti-reflection film forming apparatus 31 in which a lower anti-reflection film composed of an organic acid is formed (Step S2). The wafer W is then transferred to the UV radiation apparatus 41 in which the UV light is radiated to the entire surface of the lower anti-reflection film being the base film (Step S3). The polarity of the base film composed of the organic acid is lower than the polarity of the resist solution, but the UV light is radiated to the surface of the base film to increase the polarity, thereby making the polarity of the base film almost the same as the polarity of the resist solution.

On the other hand, in the case where the lower anti-reflection film composed of the non-organic acid has been formed on the wafer W, the wafer W is transferred to the HMDS treatment apparatus 42, and the surface of the lower anti-reflection film as the base film is treated with the HMDS gas, namely, subjected to the HMDS treatment (Step S4). The lower anti-reflection film composed of the non-organic acid is, for example, SiON or the like formed by a CVD (Chemical Vapor Deposition) method of, and its polarity is higher than the polarity of the resist film. Hence, the surface of the lower anti-reflection film composed of the non-organic acid, namely, the surface of the base film is treated with the HMDS gas as explained above and thereby covered with hydrophobic groups (specifically, methyl groups) to be decreased in polarity, whereby the polarity of the base film becomes almost the same as the polarity of the resist solution. Note that by increasing the time of performing the HMDS treatment, the degree of decreasing the polarity can be increased.

After Step S1, whether the processes at Step S2 and Step S3 are executed, or the process at Step S4 is executed is decided, for example, in a treatment recipe for the wafer W.

After a polarity adjusting process on the base film surface as at Step S3 or Step S4, the wafer W is transferred to the resist coating apparatus 32 in which the coating film of the resist solution is formed on the base film of the wafer W (Step S5). In the resist coating apparatus 32, for example, the coating film of the resist solution is formed, for example, so that the film thickness of the resist film becomes 50 nm or less.

Next, the wafer W is transferred to the thermal treatment apparatus 40 and subjected to a pre-baking (PAB) treatment (Step S6). This evaporates the solvent contained in the coating film of the resist solution, whereby the coating film is solidified to form into the resist film. In this embodiment, the polarity of the surface of the base film is adjusted, so that during a period after the resist solution is applied until the coating film of the resist solution is solidified, the solute in the resist solution never moves to the base film side. Therefore, in the coating film of the resist solution and the resist film, the solute is never unevenly distributed on the base film side.

Thereafter, the wafer W is transferred to the exposure apparatus 12 and subjected to exposure processing in a desired pattern (Step S7). The wafer W is then transferred to the thermal treatment apparatus 40 and subjected to post-exposure baking treatment (Step S8).

Subsequently, the wafer W is transferred to the developing treatment apparatus 30 and subjected to a developing treatment (Step S9). As explained above, the solute in the resist solution is not unevenly distributed in the resist film, and a portion where the bond between the resist film and the base film is strong does not exist. Therefore, the wide portion is not formed at the boundary portion of the resist pattern formed by development with the base film B, so that the resist pattern with excellent roughness can be obtained.

After the completion of the developing treatment, the wafer W is transferred to the thermal treatment apparatus 40 and subjected to a post-baking treatment (Step S10). Then, the wafer W is transferred to the cassette C on the predetermined cassette stage plate 21, namely, transferred out to the outside of the substrate treatment system 1 (Step S11), with which a serial photolithography process is completed.

According to this embodiment, the polarity is increased or decreased according to the polarity of the surface of the base film before the resist solution is applied onto the base film to make the polarity of the surface of the base film coincide with the polarity of the resist solution. Accordingly, the uneven distribution of the solute in the resist solution never occurs, so that the acid produced in the resist film due to the exposure is sufficiently diffused also in the region on the base film side. Therefore, the wide portion is not formed at the boundary portion of the resist pattern with the base film, so that a resist pattern improved in roughness such as LER can be obtained. In particular, in the case of a small film thickness of 50 nm or less, the uneven distribution of the solute in the resist solution does not occur and the wide portion is not formed, so that the roughness of the resist pattern can be improved.

Modified Example 1 of First Embodiment

In the above example, the treatment using the HMDS gas is performed as the treatment of decreasing the polarity of the base film surface. Instead of this, for example, a TMAH (tetramethylammonium hydroxide) solution may be supplied to the base film surface to substitute methyl groups for the hydrogen atoms of the hydroxyl groups on the base film surface to thereby decrease the polarity. Note that in the case of using the TMAH solution as the developing solution, a treatment of decreasing the polarity of the base film surface using the TMAH solution as above may be performed in the developing treatment apparatus 30.

Modified Example 2 of First Embodiment

In the above example, when the lower anti-reflection film as the base film is composed of the non-organic acid and the polarity of the base film surface is high, the treatment of forming the resist film on the base film is performed immediately after the HMDS treatment. Instead of this, a treatment of removing the hydrophobic groups (specifically, the methyl groups) on the base film surface decreased in polarity by the HMDS treatment or the like may be performed, and then the treatment of forming the resist film on the base film may be performed. The treatment of removing the hydrophobic groups on the base film surface after the HMDS treatment is, for example, a treatment of radiating a wavelength of the UV light having a wavelength of 172 nm to the base film surface in the UV radiation apparatus 41. By removing the hydrophobic groups as above, the polarity of the base film surface decreased in polarity can be increased again. Note that the degree of increasing the polarity again can be adjusted, for example, by a dose amount of the UV light.

Figure 7:
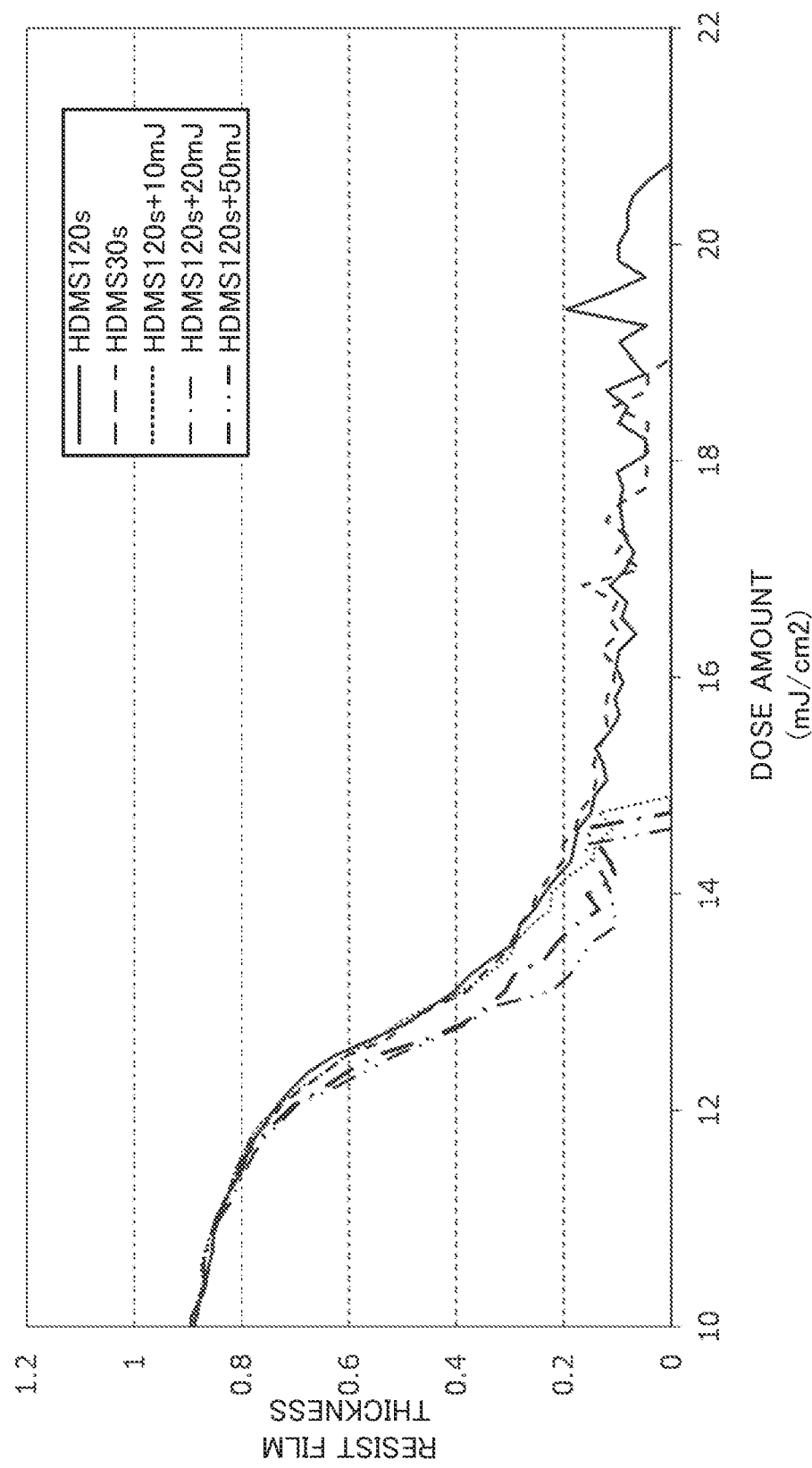
FIG. 7 is a chart for explaining the effect of the wafer treatment according to a modified example of the first embodiment.

The results of performing the EUV exposure and the development in the case of forming a resist film for EUV exposure on the base film immediately after the HMDS treatment and in the case of forming the same resist film on the base film subjected to the UV radiation treatment after the HMDS treatment are illustrated in FIG. 7. In FIG. 7, the horizontal axis indicates the dose amount in the EUV exposure and the vertical axis indicates the standardized film thickness of the resist film after the development. Besides, the solid line indicates the result when the HMDS treatment was performed for 120 seconds without performing the UV radiation treatment for removing the hydrophobic groups, and the broken line indicates the result when the HMDS treatment was performed for 30 seconds without performing the UV radiation treatment. The dotted line indicates the result when the HMDS treatment was performed for 120 seconds after performing the UV radiation treatment with the dose amount set to 10 mJ/cm$^2$, the one-dotted chain line indicates the result when the HMDS treatment was performed for 120 seconds after performing the UV radiation treatment with the dose amount set to 20 mJ/cm$^2$, and the two-dotted chain line indicates the result when the HMDS treatment was performed for 120 seconds after performing the UV radiation treatment with the dose amount set to 50 mJ/cm$^2$.

In FIG. 7, as indicated by the solid line and the broken line, the lower layer portion of the resist film sometimes remains after the development even only by the HMDS treatment unless the dose amount during the EUV exposure is increased. It is estimated that this is because an altered layer at the boundary between the base film and the resist film becomes thick since the polarity of the base film excessively decreases only by the HMDS treatment.

In contrast to the above, when the polarity of the base film is increased by performing the UV radiation treatment after the HMDS treatment as indicated by the dotted line, the one-dotted chain line, and the two-dotted chain line, the resist film does not remain any longer after the development even when the dose amount during the EUV exposure is low.

The above results show that the altered layer sometimes becomes thick only by the HMDS treatment but, even in this case, the UV radiation treatment is performed after the HMDS treatment to increase the polarity of the base film and thereby can make the altered layer thin.

Note that the wavelength of the UV light used for removing the hydrophobic groups after the HMDS is 172 nm in the above example, but UV light having another wavelength may be used as long as it is possible to remove the hydrophobic groups. Besides, the method of removing the hydrophobic groups after HMDS is not limited to the method of radiating the UV light but may be, for example, a method of heating the wafer W.

Modified Example 3 of First Embodiment

In the above example, when the base film composed of the non-organic acid has been formed, the treatment of decreasing the polarity of the base film surface is performed. Instead of this, a base film composed of an organic acid may be formed on the base film composed of the non-organic acid, then the UV radiation treatment may be performed to increase the polarity of the base film surface at the uppermost layer, and the resist film may be formed on the surface.

Second Embodiment

Figure 8:
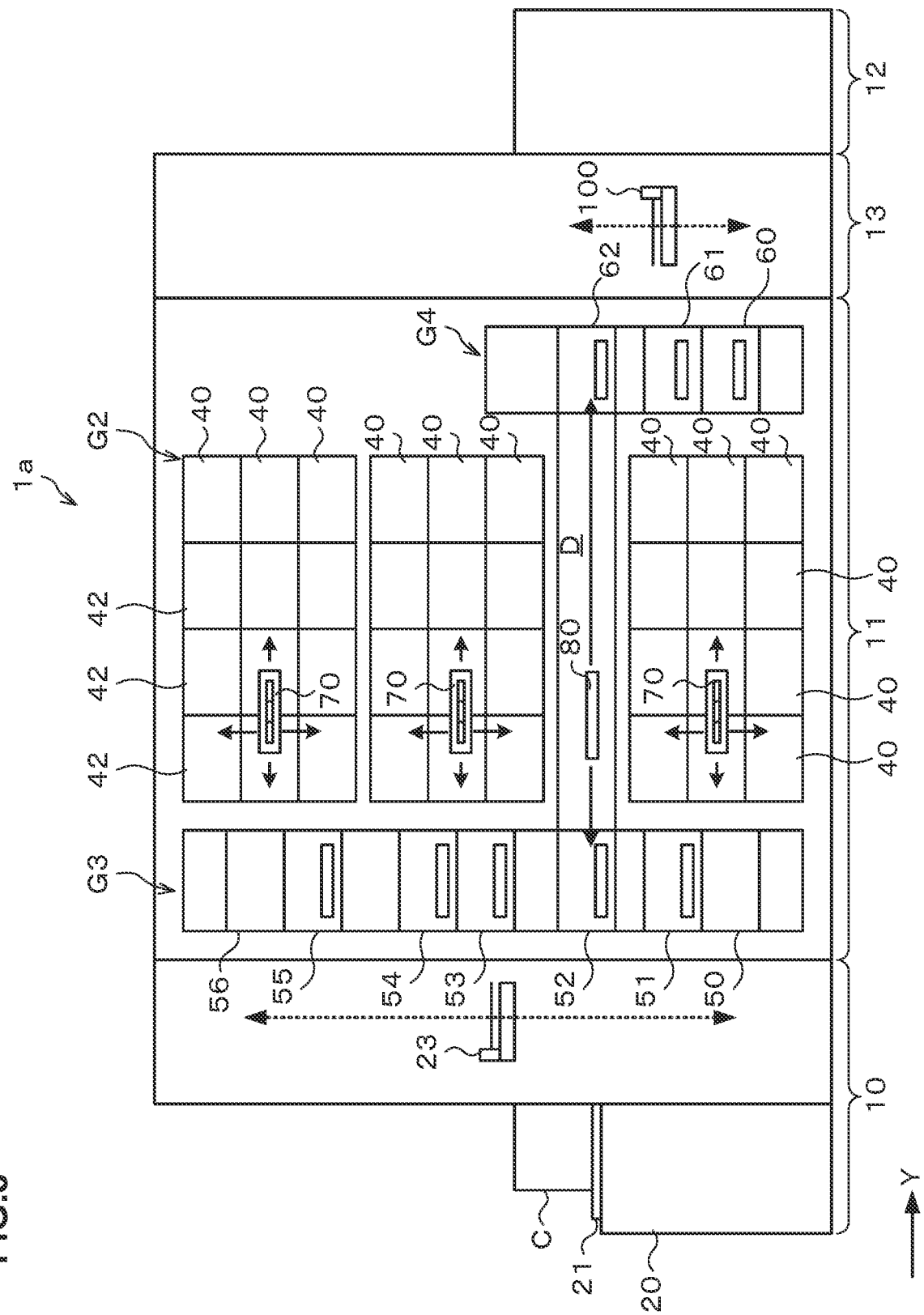
FIG. 8 is a rear view illustrating the outline of a configuration of a substrate treatment system according to a second embodiment.
Figure 9:
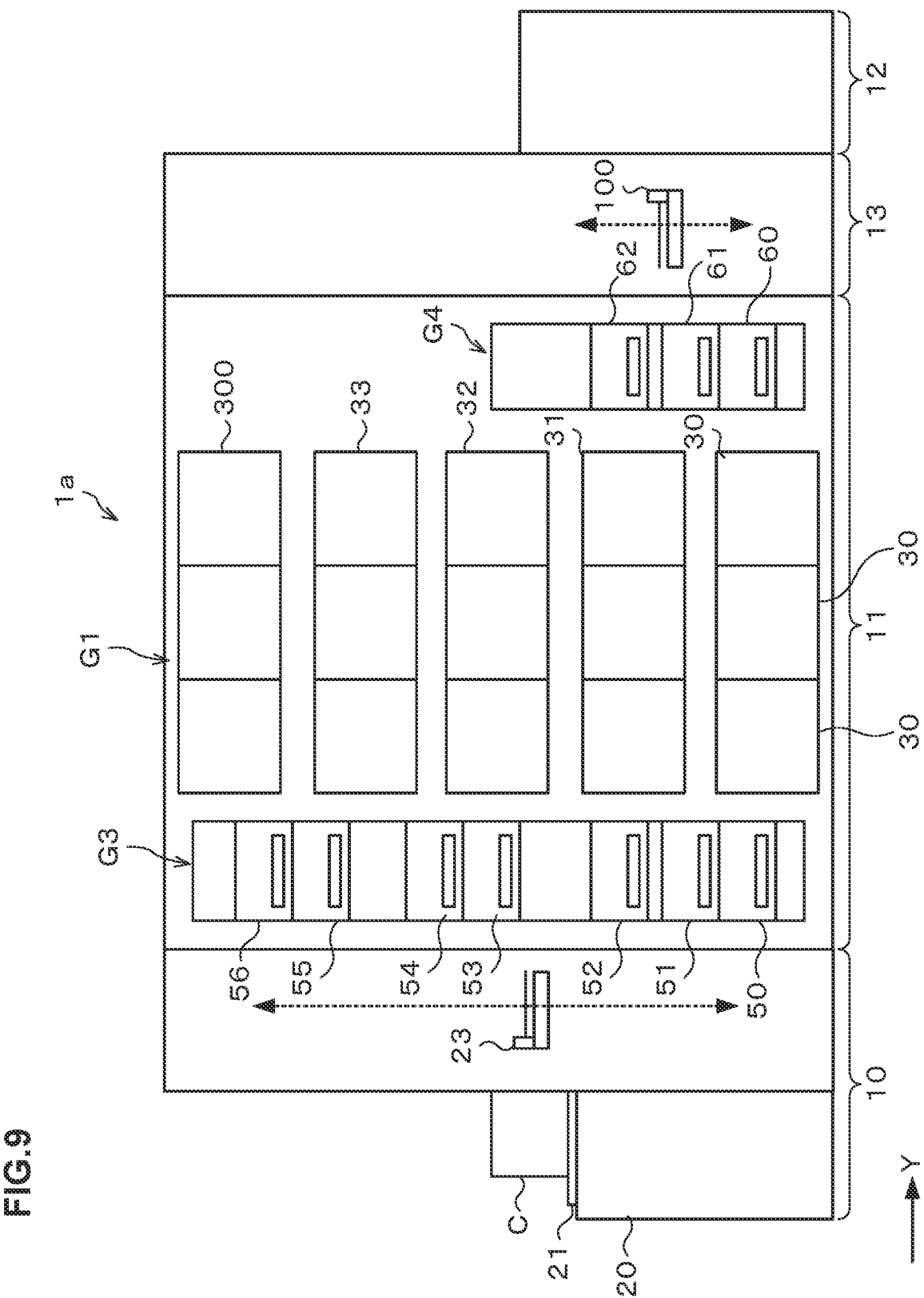
FIG. 9 is a front view illustrating the outline of the configuration of the substrate treatment system according to the second embodiment.

FIG. 8 and FIG. 9 are a rear view and a front view illustrating the outline of an internal configuration of a substrate treatment system 1a according to a second embodiment.

The substrate treatment system 1a according to this embodiment does not include, in the second block G2, the UV radiation apparatus 41 and the HMDS treatment apparatus 42 included in the substrate treatment system 1 in the first embodiment, as illustrated in FIG. 8. Instead, the substrate treatment system 1a in this embodiment has covering apparatuses 300 in the first block G1 as illustrated in FIG. 8.

The covering apparatus 300 is an example of the polarity adjusting apparatus and performs a covering treatment of applying a solution in which a polar polymer and a nonpolar polymer exist at a ratio according to the polarity of the resist solution to the base film surface to cover the base film surface with a predetermined film composed of the polar polymer and the nonpolar polymer. The covering is performed, for example, by spin coating. The predetermined film is formed from the solution in which the polar polymer and the nonpolar polymer exist at the ratio according to the polarity of the resist solution, so that the polarity of the predetermined film becomes almost the same as the polarity of the resist solution. Note that the above covering treatment can be said to be a treatment of decreasing the polarity of the lower anti-reflection film, namely, the base film when the polarity of the base film is higher than the polarity of the resist solution and a treatment of increasing the polarity of the base film when the polarity of the base film is lower than the polarity of the resist solution. Further, the polar polymer is, for example, polymethyl methacrylate (PMMA), and the nonpolar polymer is, for example, polystyrene (PS). Besides, the solution used for covering the base film surface is a block copolymer, which is a macromolecule made by linearly combining the polar polymer and the nonpolar polymer, made into a solution form with a solvent. Note that when the polar polymer is PMMA and the nonpolar polymer is PS, the solvent used for the solution is, for example, an organic solvent such as toluene, propyleneglycol monomethyl ether acetate (PGMEA) or the like.

In the substrate treatment system 1 in the first embodiment, the content of the adjusting treatment of the polarity of the base film performed before the formation of the coating film of the resist solution is different depending on the kind of the base film. In contrast to this, in the substrate treatment system 1a in this embodiment, the content of the adjusting treatment of the polarity of the base film does not depend on the kind of the base film, but the treatment of covering the base film with the above predetermined film having almost the same polarity as that of the resist solution is performed as the adjusting treatment of the polarity of the base film. Then, the coating film of the resist solution is formed on the base film covered with the predetermined film having almost the same polarity as that of the resist solution. Therefore, during a period after the resist solution is applied until the coating film of the resist solution is solidified, the solute in the resist solution never moves to the base film side. Accordingly, in the coating film of the resist solution and the resist film, the solute is never unevenly distributed on the base film side. Therefore, also in this embodiment, the wide portion is not formed at the boundary portion of the resist pattern with the base film, so that the roughness of the resist pattern can be improved.

Note that the solution used for covering the base film is previously decided, for example, in the treatment recipe.

Modified Example of Second Embodiment

Figure 10:
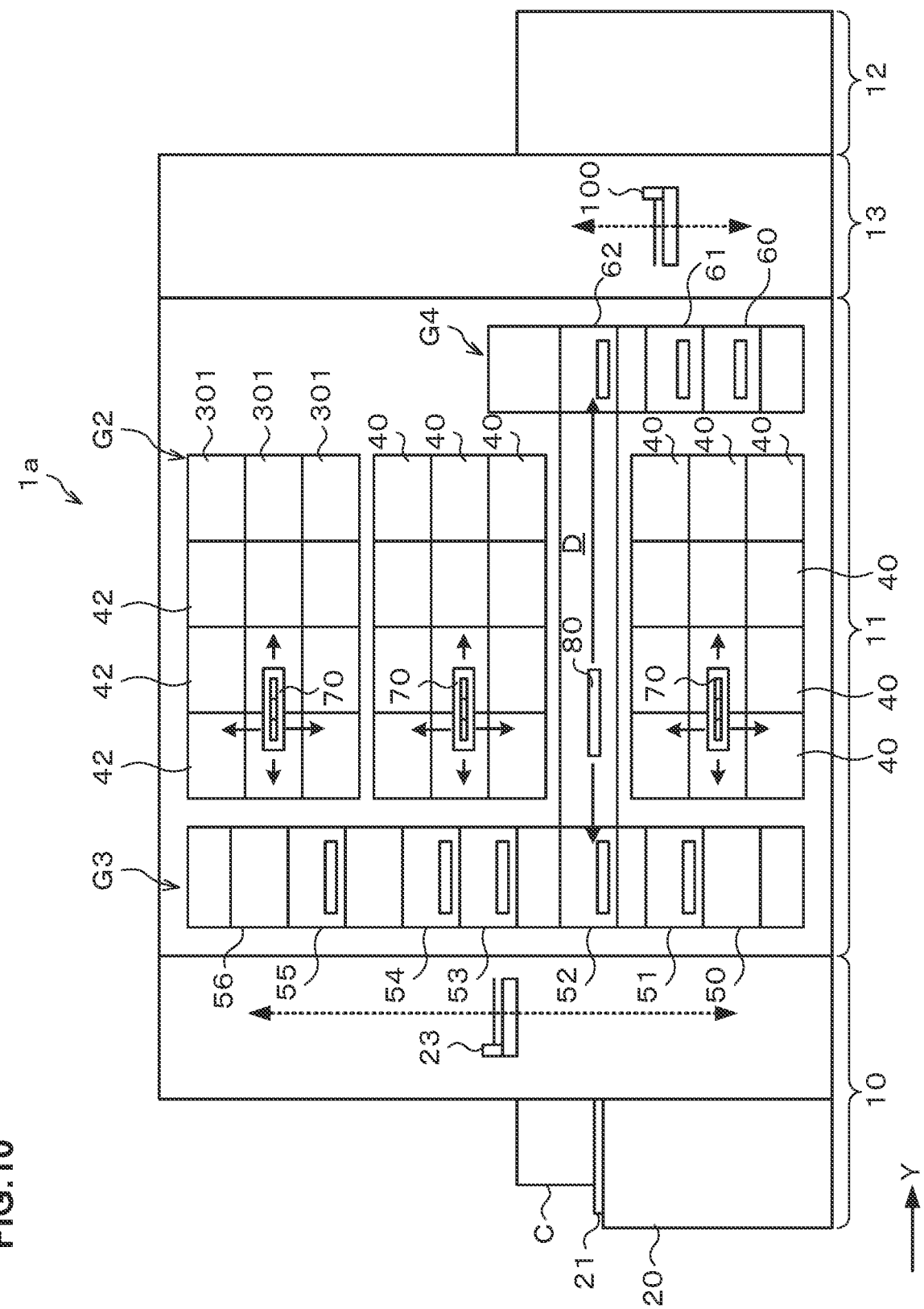
FIG. 10 is a rear view illustrating the outline of an internal configuration of a substrate treatment system according to a modified example of the second embodiment.

FIG. 10 is a rear view illustrating the outline of an internal configuration of a substrate treatment system 1a according to a modified example of the second embodiment.

In the covering apparatus 300 in the above example, the solution in which the polar polymer and the nonpolar polymer exist at the ratio according to the polarity of the resist solution is applied to the base film surface to cover the base film with the film having almost the same polarity as that of the resist solution. In contrast to this, covering apparatuses 301 provided in the second block G2, for example, as illustrated in FIG. 10 cover the base film as follows. Specifically, the covering apparatus 301 supplies a mixed gas, in which gas made by evaporating the solution of the polar polymer and gas made by evaporating the solution of the nonpolar polymer are mixed according to the polarity of the resist solution, to the base film surface. Thus, the covering apparatus 301 covers the base film with a self-assembled monolayer composed of the polar polymer and the nonpolar polymer. Also in this example, the film covering the base film has almost the same polarity as that of the resist solution. Therefore, forming the coating film of the resist solution on the base film covered as in the above manner prevents the solute in the resist solution from being unevenly distributed on the base film side in the coating film of the resist solution and the resist film. Therefore, also in this example, the wide portion is not formed at the boundary portion of the resist pattern with the base film, so that the roughness of the resist pattern can be improved.

Note that the mixing ratio in the mixed gas used for covering the base film is previously decided, for example, in the treatment recipe.

Third Embodiment

Figure 11:
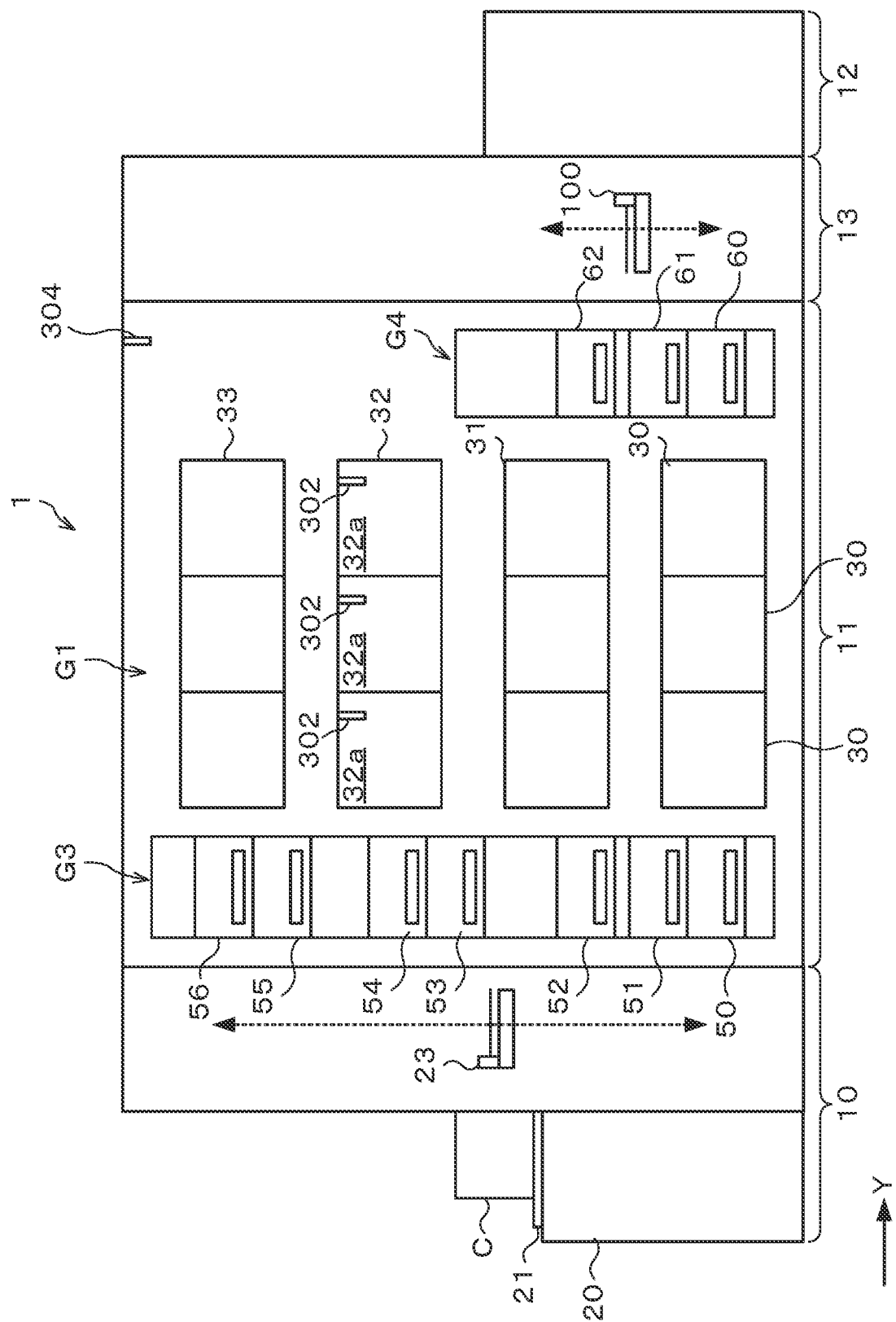
FIG. 11 is a front view illustrating the outline of an internal configuration of a substrate treatment system according to a third embodiment.
Figure 12:
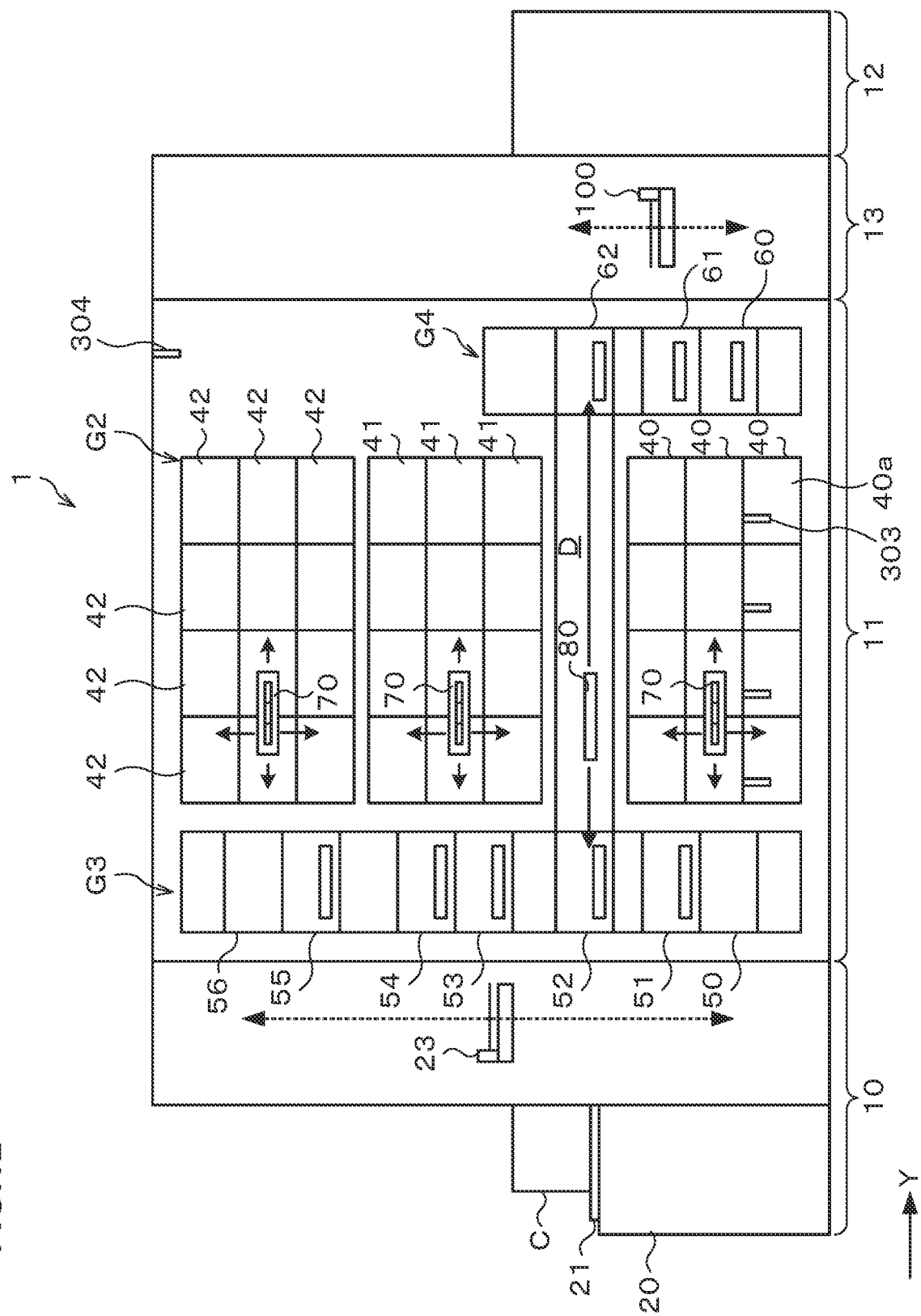
FIG. 12 is a rear view illustrating the outline of the internal configuration of the substrate treatment system according to the third embodiment.

FIG. 11 and FIG. 12 are a front view and a rear view illustrating the outline of an internal configuration of a substrate treatment system 1b according to a third embodiment.

The first and second embodiments are to prevent the solute in the resist solution from being unevenly distributed on the base film side in the coating film of the resist solution and the resist film and, in particular, relate to the solute having a polarity in the resist solution.

However, a nonpolar solute is sometimes contained in the resist solution. In this case, if the coating film of the resist solution is exposed to an air atmosphere, the nonpolar solute moves to the surface side of the coating film and comes to be unevenly distributed. Therefore, after a lapse of time, the nonpolar solute is unevenly distributed on the surface side in the coating film of the resist solution. The uneven distribution of the nonpolar solute is considered to contribute to the acceleration of the reaction at the tip end portion of the resist pattern and to the formation of an odd-shaped part (see FIG. 1) as a result.

Hence, in the substrate treatment system 1b in this embodiment, a nozzle 302 is provided which supplies the solvent for the resist solution in a gas form into a treatment chamber 32a of the resist coating apparatus 32 as illustrated in FIG. 11.

Further, in the substrate treatment system 1b, a nozzle 303 is provided which supplies gas made by evaporating the solvent for the resist solution into a treatment chamber 40a of the thermal treatment apparatus 40 relating to the PAB treatment as illustrated in FIG. 12.

Furthermore, in the substrate treatment system 1b, a nozzle 304, which supplies a predetermined gas that is not the nonpolar gas to a transfer space from the resist coating apparatus 32 to the thermal treatment apparatus 40 relating to the PAB treatment, namely, the wafer transfer region D, is provided in the treatment station 11. The predetermined gas is, for example, a halogen gas, or may be an inert gas such as an Ar gas or an $N_2$ gas.

According to this embodiment, the above nozzle 302 and nozzle 303 are provided to supply the solvent for the resist solution in a gas form into the corresponding treatment chambers during the application treatment of the resist solution and/or during the PAB treatment. Therefore, it is possible to suppress the movement of the nonpolar component in the resist solution to the surface side of the coating film during a period after the resist solution is applied until its coating film is solidified to form into the resist film. More specifically, it is possible to suppress the movement of the nonpolar component (solute) to the surface side of the coating film of the resist solution during the coating treatment of the resist solution and/or during the PAB treatment. In other words, it is possible to suppress the uneven distribution of the nonpolar solute on the surface side of the coating film in the coating film of the resist solution. Accordingly, it is possible to suppress the formation of the odd-shaped part at the tip end portion of the resist pattern when the resist film formed by solidifying the coating solution is exposed and developed to form the resist pattern. Accordingly, the roughness at the tip end of the resist pattern can be improved.

Note that one of the nozzle 302 and the nozzle 303 may be omitted. However, in the case where both the nozzle 302 and the nozzle 303 are provided, the roughness at the tip end of the resist pattern can be significantly improved.

Further, the gas to be supplied from the nozzle 302 and the nozzle 303 is not limited to the one made by evaporating the solvent for the resist solution but may be the one excluding a nonpolar gas, and may be, for example, a halogen gas or an inert gas such as an Ar gas or an $N_2$ gas.

Further, according to this embodiment, the above nozzle 304 is provided to supply the predetermined gas such as a halogen gas to the wafer transfer region D during the transfer from the resist coating apparatus 32 to the thermal treatment apparatus 40 relating to the PAB treatment. Therefore, it is possible to suppress the movement of the nonpolar component in the resist solution to the surface side of the coating film of the resist solution during the transfer. Accordingly, the formation of the odd-shaped part at the tip end portion of the resist pattern can be suppressed and the roughness at the tip end of the resist pattern can be improved.

Note that the gas made by evaporating the solvent for the resist solution may be supplied from the nozzle 304.

Fourth Embodiment

Figure 13:
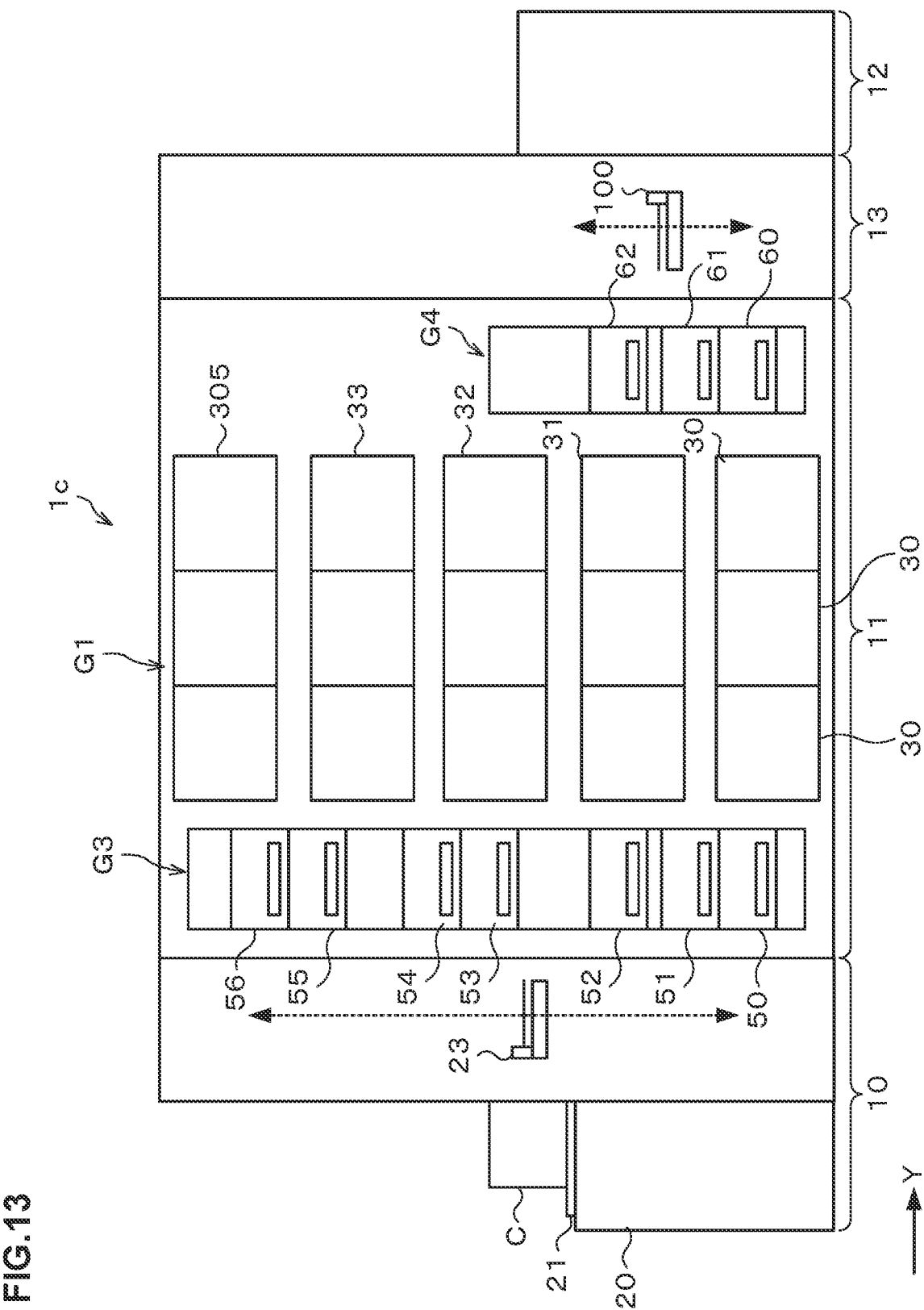
FIG. 13 is a front view illustrating the outline of an internal configuration of a substrate treatment system according to a fourth embodiment.

FIG. 13 is a front view illustrating the outline of an internal configuration of a substrate treatment system 1c according to a fourth embodiment.

In the third embodiment, the solvent for the resist solution in a gas form is supplied to the treatment chamber 32a of the resist coating apparatus 32 in order to prevent the uneven distribution of the nonpolar solute contained in the resist solution. In contrast to this, in this embodiment, the uneven distribution of the nonpolar solute is prevented by film forming apparatuses 305 provided in the first block G1, for example, as illustrated in FIG. 13.

Specifically, the film forming apparatus 305 applies a predetermined solution to the surface of the coating film after the coating film of the resist solution is formed on the base film of the wafer W and before the PAB treatment, to form a predetermined film. The above predetermined solution is a solution containing the polar polymer and the nonpolar polymer in which the composition ratio between the polar polymer and the nonpolar polymer is adjusted to prevent the uneven distribution of the nonpolar solute. The predetermined solution is a water-based polymer solution to be used, for example, for the formation of the upper anti-reflection film (TARC), and more specifically, for example, a copolymer of the polar polymer and the nonpolar polymer made into a solution form with water. Further, the predetermined solution may be a block copolymer, which is a macromolecule made by linearly combining the polar polymer and the nonpolar polymer, made into a solution form with an organic solvent as in the second embodiment. Note that the formation of the predetermined film of the predetermined solution is performed for example, by spin coating.

According to this embodiment, the predetermined film is formed on the surface of the coating film of the resist solution using the predetermined solution in which the composition ratio between the polar polymer and the nonpolar polymer is adjusted, after the formation of the coating film of the resist solution and before the PAB treatment. Therefore, it is possible to suppress the uneven distribution of the nonpolar solute in the resist solution on the surface side of the coating film in the coating film of the resist solution during a period after the resist solution is applied until the coating film is solidified to form into the resist film. Accordingly, it is possible to suppress the formation of the odd-shaped part at the tip end portion of the resist pattern when the resist film formed by solidifying the coating solution is exposed and developed to form the resist pattern. Accordingly, the roughness at the tip end of the resist pattern can be improved.

Modified Example of Fourth Embodiment

Figure 14:
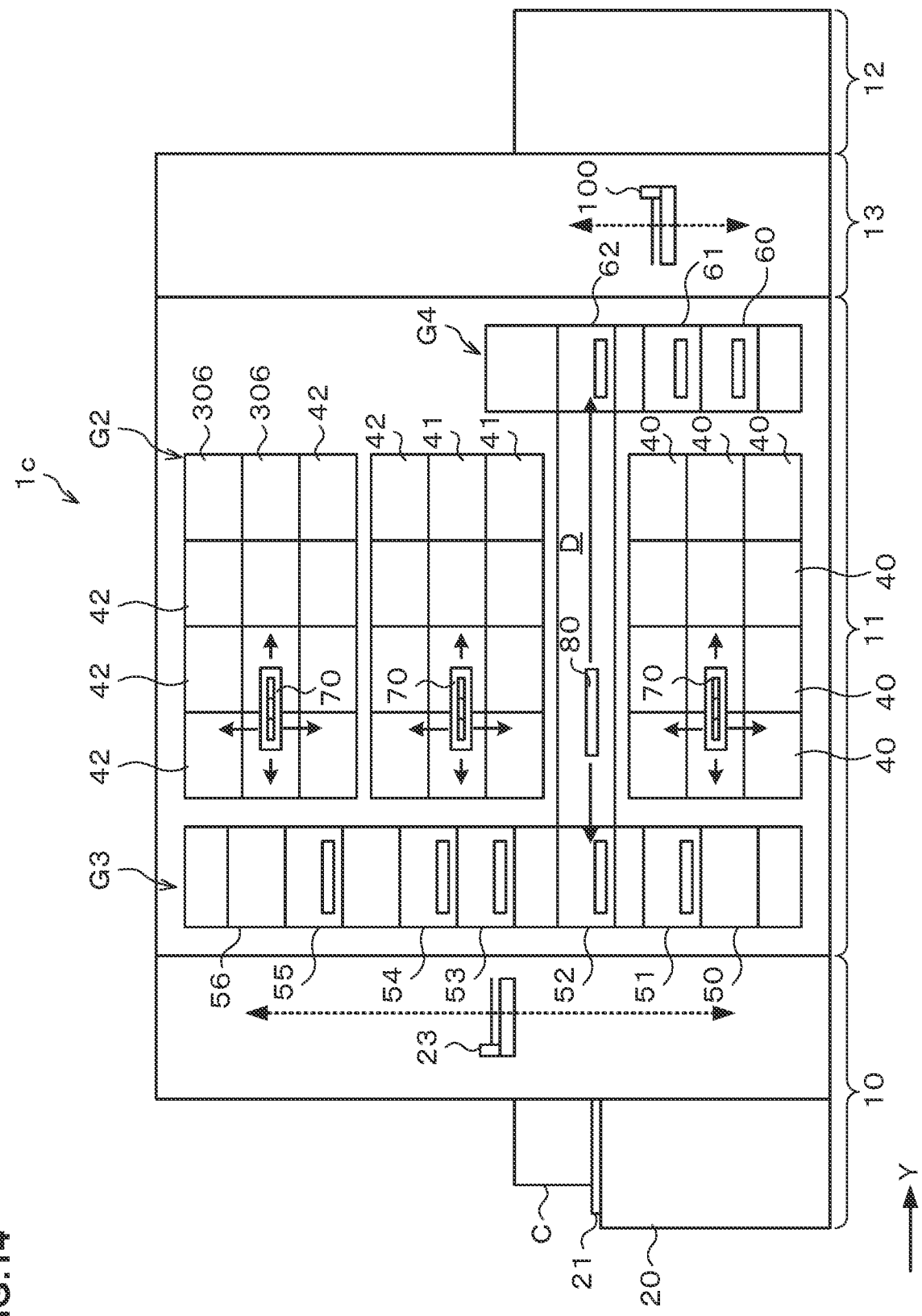
FIG. 14 is a rear view illustrating the outline of an internal configuration of a substrate treatment system according to a modified example of the fourth embodiment.

FIG. 14 is a rear view illustrating the outline of an internal configuration of a substrate treatment system 1c according to a modified example of the fourth embodiment.

In the film forming apparatus 305 in the above example, the predetermined solution is applied to the surface of the coating film of the resist solution to form the predetermined film on the surface of the resist film. In contrast to this, a film forming apparatus 306 provided, for example, in the second block G2 as illustrated in FIG. 14 forms a predetermined film on the surface of the coating film of the resist solution in the following manner. Specifically, the film forming apparatus 306 supplies a predetermined gas to the base film surface to form a predetermined self-assembled monolayer on the coating film of the resist solution. Note that for the predetermined gas, for example, the mixed gas exemplified in the modified example of the second embodiment can be used.

In this example, the predetermined self-assembled monolayer is formed on the surface of the coating film after the formation of the coating film of the resist solution and before the PAB treatment. Therefore, it is possible to suppress the uneven distribution of the nonpolar solute in the resist solution on the surface side of the coating film in the coating film of the resist solution during a period after the resist solution is applied until the coating film is solidified to form into the resist film. Accordingly, the roughness at the tip end of the resist pattern can be improved as in the example in FIG. 13.

Note that in the fourth embodiment and its modified example, when the predetermined film formed on the coating film of the resist solution inhibits exposure, the predetermined film is removed before the exposure.

Besides, when not inhibiting exposure, the predetermined film may be removed after the exposure and before the development or at the time of the development.

Note that the predetermined film formed with the water-based polymer solution used for the formation of TARC can be removed with water.

Besides, the self-assembled monolayer can be removed, for example, with thinner though depending on its composition.

The embodiments disclosed herein are only examples in all respects and should not be considered to be restrictive. Omissions, substitutions and changes in various forms of the embodiments described herein may be made without departing from the scope and spirit of attached claims.

Note that the following configurations also belong to the technical scope of this disclosure.

(1) A substrate treatment method of treating a treatment object substrate, the substrate treatment method including before applying a resist solution for forming a resist film onto a base film formed on a substrate surface of the treatment object substrate, performing a treatment of decreasing a polarity of the base film when the polarity of the base film is higher than a polarity of the resist solution, and performing a treatment of increasing the polarity of the base film when the polarity of the base film is lower than the polarity of the resist solution.

According to the (1), it is possible to make the polarity of the resist film and the polarity of the base film almost the same, thus suppressing the movement of the solute in the resist solution to the base film side in the coating film of the resist solution. Therefore, it is possible to suppress the uneven distribution of the solute in the resist solution in the coating film of the resist solution, thus avoiding interference with the diffusion of the acid in the resist film. Accordingly, the wide portion is not formed in the resist pattern, so that the roughness such as LER can be improved.

(2) The substrate treatment method according to the (1), wherein the treatment of decreasing the polarity of the base film is a treatment of supplying an HMDS gas to the base film.

(3) The substrate treatment method according to the (1) or (2), wherein the treatment of decreasing the polarity of the base film is a treatment of supplying a TMAH solution to the base film.

(4) The substrate treatment method according to any one of the (1) to (3), wherein the treatment of increasing the polarity of the base film is a treatment of radiating UV light to the base film.

(5) The substrate treatment method according to any one of the (1) to (4), further including after the treatment of decreasing the polarity of the base film, removing a hydrophobic group on the surface of the base film decreased in polarity.

(6) The substrate treatment method according to the (5), wherein the treatment of removing the hydrophobic group is a treatment of radiating UV light to the base film decreased in polarity.

(7) The substrate treatment method according to the (1), wherein the treatment of decreasing the polarity of the base film and the treatment of increasing the polarity of the base film are treatments of covering the base film with a predetermined film composed of a polar polymer and a nonpolar polymer.

(8) The substrate treatment method according to the (7), wherein the predetermined film is formed by applying a solution in which the polar polymer and the nonpolar polymer exist to the base film.

(9) The substrate treatment method according to the (7), wherein the predetermined film is a self-assembled monolayer formed by supplying a mixed gas in which gas made by evaporating a solution containing the polar polymer and gas made by evaporating a solution containing the nonpolar polymer are mixed, to the base film.

(10) The substrate treatment method according to any one of the (1) to (9), further including performing a treatment of suppressing movement of a nonpolar component contained in the resist solution to a surface layer side in a coating film of the resist solution formed by being applied onto the base film.

According to the (9), the roughness of the resist pattern can be further improved.

(11) The substrate treatment method according to the (10), further including an application step of applying the resist solution onto the base film, wherein the treatment of suppressing the movement of the nonpolar component to the surface layer side is a treatment of supplying gas made by evaporating a solvent for the resist solution, a halogen gas, or an inert gas into a treatment chamber of a resist coating apparatus configured to perform the application in the applying the resist solution onto the base film.

(12) The substrate treatment method according to the (10) or (11), further including forming a resist film by heating the coating film of the resist solution formed on the base film, wherein the treatment of suppressing the movement of the nonpolar component to the surface layer side is a treatment of supplying gas made by evaporating a solvent for the resist solution, a halogen gas, or an inert gas into a treatment chamber of a thermal treatment apparatus configured to perform the heating in the forming the resist film.

(13) The substrate treatment method according to the (10), wherein the treatment of suppressing the movement of the nonpolar component to the surface layer side is a treatment of forming another predetermined film on the coating film before the heating the coating film of the resist solution formed on the base film.

(14) A substrate treatment system for treating a treatment object substrate, the substrate treatment system including a polarity adjusting apparatus configured to, before applying a resist solution for forming a resist film onto a base film formed on a substrate surface of the treatment object substrate, perform a treatment of decreasing a polarity of the base film when the polarity of the base film is higher than a polarity of the resist solution, and perform a treatment of increasing the polarity of the base film when the polarity of the base film is lower than the polarity of the resist solution.

EXPLANATION OF CODES 1, 1a, 1b, 1c substrate treatment system
13 interface station
41 UV radiation apparatus
42 HMDS treatment apparatus
300, 301 covering apparatus
B base film
W wafer

What is claimed is:

1. A substrate treatment method of treating a plurality of treatment object substrates including a treatment object substrate, each of the treatment object substrates having a base film polarity which may be greater than or less than a resist solution polarity, the substrate treatment method comprising before applying a resist solution for forming a resist film onto a base film formed on a substrate surface of the treatment object substrate, making, by a substrate treatment apparatus, a determination which one of a first treatment and a second treatment to perform based on the treatment object substrate, wherein the substrate treatment apparatus is configured to be able to perform both the first treatment and the second treatment, wherein the first treatment is a treatment of decreasing a polarity of the base film to bring it closer to a polarity of the resist solution, and the second treatment is a treatment of increasing the polarity of the base film to bring it closer to the polarity of the resist solution, responsive to the determination determining to perform the first treatment, perform using the substrate treatment apparatus the first treatment of decreasing the polarity of the base film, and responsive to the determination determining to perform the second treatment, perform using the substrate treatment apparatus the second treatment of increasing the polarity of the base film.

2. The substrate treatment method according to claim 1, wherein the treatment of decreasing the polarity of the base film is a treatment of supplying an HMDS gas to the base film.

3. The substrate treatment method according to claim 1, wherein the treatment of decreasing the polarity of the base film is a treatment of supplying a TMAH solution to the base film.

4. The substrate treatment method according to claim 1, wherein the treatment of increasing the polarity of the base film is a treatment of radiating UV light to the base film.

5. The substrate treatment method according to claim 1, further comprising after the treatment of decreasing the polarity of the base film, removing a hydrophobic group on the surface of the base film decreased in polarity.

6. The substrate treatment method according to claim 5, wherein the removing the hydrophobic group is a treatment of radiating UV light to the base film decreased in polarity.

7. The substrate treatment method according to claim 1, wherein the treatment of decreasing the polarity of the base film and the treatment of increasing the polarity of the base film are treatments of covering the base film with a predetermined film composed of a polar polymer and a nonpolar polymer.

8. The substrate treatment method according to claim 7, wherein the predetermined film is formed by applying a solution in which the polar polymer and the nonpolar polymer exist to the base film.

9. The substrate treatment method according to claim 7, wherein the predetermined film is a self-assembled monolayer formed by supplying a mixed gas in which gas made by evaporating a solution containing the polar polymer and gas made by evaporating a solution containing the nonpolar polymer are mixed, to the base film.

10. The substrate treatment method according to claim 1, further comprising performing a treatment of suppressing movement of a nonpolar component contained in the resist solution to a surface layer side in a coating film of the resist solution formed by being applied onto the base film.

11. The substrate treatment method according to claim 10, further comprising applying the resist solution onto the base film, wherein the treatment of suppressing the movement of the nonpolar component to the surface layer side is a treatment of supplying gas made by evaporating a solvent for the resist solution, a halogen gas, or an inert gas into a treatment chamber of a resist coating apparatus configured to perform the application in the applying the resist solution onto the base film.

12. The substrate treatment method according to claim 10, further comprising forming a resist film by heating the coating film of the resist solution formed on the base film, wherein the treatment of suppressing the movement of the nonpolar component to the surface layer side is a treatment of supplying gas made by evaporating a solvent for the resist solution, a halogen gas, or an inert gas into a treatment chamber of a thermal treatment apparatus configured to perform the heating in the forming the resist film.

13. The substrate treatment method according to claim 10, wherein the treatment of suppressing the movement of the nonpolar component to the surface layer side is a treatment of forming another preetermined film on the coating film before heating the coating film of the resist solution formed on the base film.

* * * * *